United States Patent
Chung

(10) Patent No.: US 9,754,924 B2
(45) Date of Patent: Sep. 5, 2017

(54) FAN-OUT POP STACKING PROCESS

(71) Applicant: Apple Inc., Cupertino, CA (US)

(72) Inventor: Chih-Ming Chung, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/164,296

(22) Filed: May 25, 2016

(65) Prior Publication Data

US 2016/0268236 A1   Sep. 15, 2016

Related U.S. Application Data

(63) Continuation of application No. 14/494,253, filed on Sep. 23, 2014, now Pat. No. 9,379,097.

(Continued)

(51) Int. Cl.
  *H01L 21/00*     (2006.01)
  *H01L 25/065*    (2006.01)
  (Continued)

(52) U.S. Cl.
  CPC ...... *H01L 25/0657* (2013.01); *H01L 21/6835* (2013.01); *H01L 21/78* (2013.01); *H01L 23/49811* (2013.01); *H01L 23/49838* (2013.01); *H01L 24/19* (2013.01); *H01L 24/20* (2013.01); *H01L 24/73* (2013.01); *H01L 24/75* (2013.01); *H01L 24/81* (2013.01); *H01L 24/92* (2013.01); *H01L 24/96* (2013.01); *H01L 24/97* (2013.01); *H01L 25/105* (2013.01); *H01L 25/50* (2013.01); *H01L 21/561* (2013.01); *H01L 21/563* (2013.01); *H01L 23/5389* (2013.01); *H01L 23/562* (2013.01); *H01L 2221/68327* (2013.01); *H01L 2224/04105* (2013.01); *H01L 2224/12105* (2013.01); *H01L 2224/16146* (2013.01); *H01L 2224/32225* (2013.01);
(Continued)

(58) Field of Classification Search
  CPC ..... H01L 25/50; H01L 21/561; H01L 21/563; H01L 21/78; H01L 23/49838; H01L 24/75; H01L 24/81; H01L 24/96; H01L 25/0657; H01L 2224/12105; H01L 2224/16146; H01L 2224/751; H01L 2224/753; H01L 2224/7555
  USPC ........................................................ 438/106
  See application file for complete search history.

(56) References Cited

U.S. PATENT DOCUMENTS 8,357,564 B2 * 1/2013 Chi .................... H01L 21/4832
                                                        257/676
8,378,476 B2   2/2013 Lee et al.
(Continued)

*Primary Examiner* — Tod T Van Roy
*Assistant Examiner* — Vu A Vu
(74) *Attorney, Agent, or Firm* — Blakely Sokoloff Taylor & Zafman LLP

(57) ABSTRACT

Package on package structures and manners of formation are described. In an embodiment, an array of trenches is formed partially through a fan-out substrate. In an embodiment, a plurality of laterally separate locations thermal interface material is dispensed onto an array of embedded bottom die. In an embodiment a thermal compression tool including an array of cavities corresponding to an array of top packages is brought into contact with the array of top packages and underlying fan-out substrate during PoP joint formation. The fan-out substrate may be secured to a vacuum chuck during several processing operations.

17 Claims, 14 Drawing Sheets

Related U.S. Application Data

(60) Provisional application No. 62/030,029, filed on Jul. 28, 2014.

(51) Int. Cl.

| | | |
|---|---|---|
| *H01L 25/00* | (2006.01) | |
| *H01L 21/78* | (2006.01) | |
| *H01L 23/00* | (2006.01) | |
| *H01L 23/498* | (2006.01) | |
| *H01L 25/10* | (2006.01) | |
| *H01L 21/683* | (2006.01) | |
| *H01L 21/56* | (2006.01) | |
| *H01L 23/538* | (2006.01) | |

(52) U.S. Cl.
CPC ........... *H01L 2224/40108* (2013.01); *H01L 2224/41171* (2013.01); *H01L 2224/48108* (2013.01); *H01L 2224/49171* (2013.01); *H01L 2224/49173* (2013.01); *H01L 2224/73151* (2013.01); *H01L 2224/73267* (2013.01); *H01L 2224/751* (2013.01); *H01L 2224/753* (2013.01); *H01L 2224/7555* (2013.01); *H01L 2224/75981* (2013.01); *H01L 2224/8136* (2013.01); *H01L 2224/81203* (2013.01); *H01L 2225/06513* (2013.01); *H01L 2225/06548* (2013.01); *H01L 2225/06568* (2013.01); *H01L 2225/06589* (2013.01); *H01L 2225/1035* (2013.01); *H01L 2225/1058* (2013.01); *H01L 2225/1082* (2013.01); *H01L 2225/1088* (2013.01); *H01L 2225/1094* (2013.01); *H01L 2924/10253* (2013.01); *H01L 2924/14* (2013.01); *H01L 2924/1431* (2013.01); *H01L 2924/15172* (2013.01); *H01L 2924/15311* (2013.01); *H01L 2924/3511* (2013.01)

(56) References Cited

U.S. PATENT DOCUMENTS

| | | |
|---|---|---|
| 2010/0155936 A1 | 6/2010 | Codding et al. |
| 2012/0074126 A1* | 3/2012 | Bang ................ H01L 21/68785 |
| | | 219/443.1 |
| 2012/0159118 A1 | 6/2012 | Wong et al. |
| 2012/0319295 A1 | 12/2012 | Chi et al. |
| 2013/0102112 A1* | 4/2013 | Chen ....................... H01L 24/75 |
| | | 438/118 |
| 2013/0249106 A1 | 9/2013 | Lin et al. |
| 2014/0045300 A1 | 2/2014 | Chen et al. |
| 2014/0054783 A1* | 2/2014 | Gong (Tony) .......... H01L 24/19 |
| | | 257/773 |
| 2014/0091473 A1 | 4/2014 | Len et al. |
| 2014/0110856 A1 | 4/2014 | Lin |
| 2014/0124955 A1 | 5/2014 | Chen et al. |
| 2014/0138816 A1 | 5/2014 | Lu et al. |
| 2014/0159251 A1 | 6/2014 | Marimuthu et al. |
| 2015/0318326 A1 | 11/2015 | Martin et al. |

* cited by examiner

FAN-OUT POP STACKING PROCESS

RELATED APPLICATIONS

The present application is a continuation of co-pending U.S. patent application Ser. No. 14/494,253 filed Sep. 23, 2014, which claims the benefit of priority from U.S. Provisional Patent Application Ser. No. 62/030,029 filed on Jul. 28, 2014, both of which are incorporated herein by reference.

BACKGROUND

Field

Embodiments described herein relate to semiconductor packaging. More particularly embodiments relate to package on package (PoP) structures and manners of fabrication.

Background Information

Package on package (PoP) applications have become increasingly popular as the demand for higher component density continues in devices, such as mobile phones, personal digital assistants (PDAs) and digital cameras. In one implementation, PoP structures include multiple memory packages stacked onto on one another. In another implementation, PoP structures include mixed logic-memory package stacks, such as system on chip (SoC) packages with memory packages. In such an implementation, the bottom package is typically the SoC package since the logic requires more I/O terminals and the top package is a memory package.

SUMMARY

Package on package structures and manners of formation that may address warpage are described. In an embodiment, an array of trenches is formed partially through a fan-out substrate prior to bonding an array of top packages to the fan-out substrate. For example, the array of trenches may be formed in an active side of the fan-out substrate, followed by mounting the active side of the fan-out substrate to a temporary adhesive layer, and removal of a carrier substrate from the fan-out substrate. The array of top packages may then be bonded to a surface of the fan-out substrate opposite the active side of the fan-out substrate. In an embodiment, at a plurality of laterally separate locations thermal interface material is dispensed onto an array of embedded bottom die of a fan-out substrate prior to bonding an array of top packages to the fan-out substrate. In an embodiment a thermal compression tool including an array of cavities corresponding to an array of top packages is brought into contact with the array of top packages and underlying fan-out substrate during PoP joint formation. In an embodiment, the fan-out substrate is held on a vacuum chuck while thermally bonding the array of top packages and the fan-out substrate. The fan-out substrate may be secured to a vacuum chuck during several processing operations.

DETAILED DESCRIPTION

Figure 1:
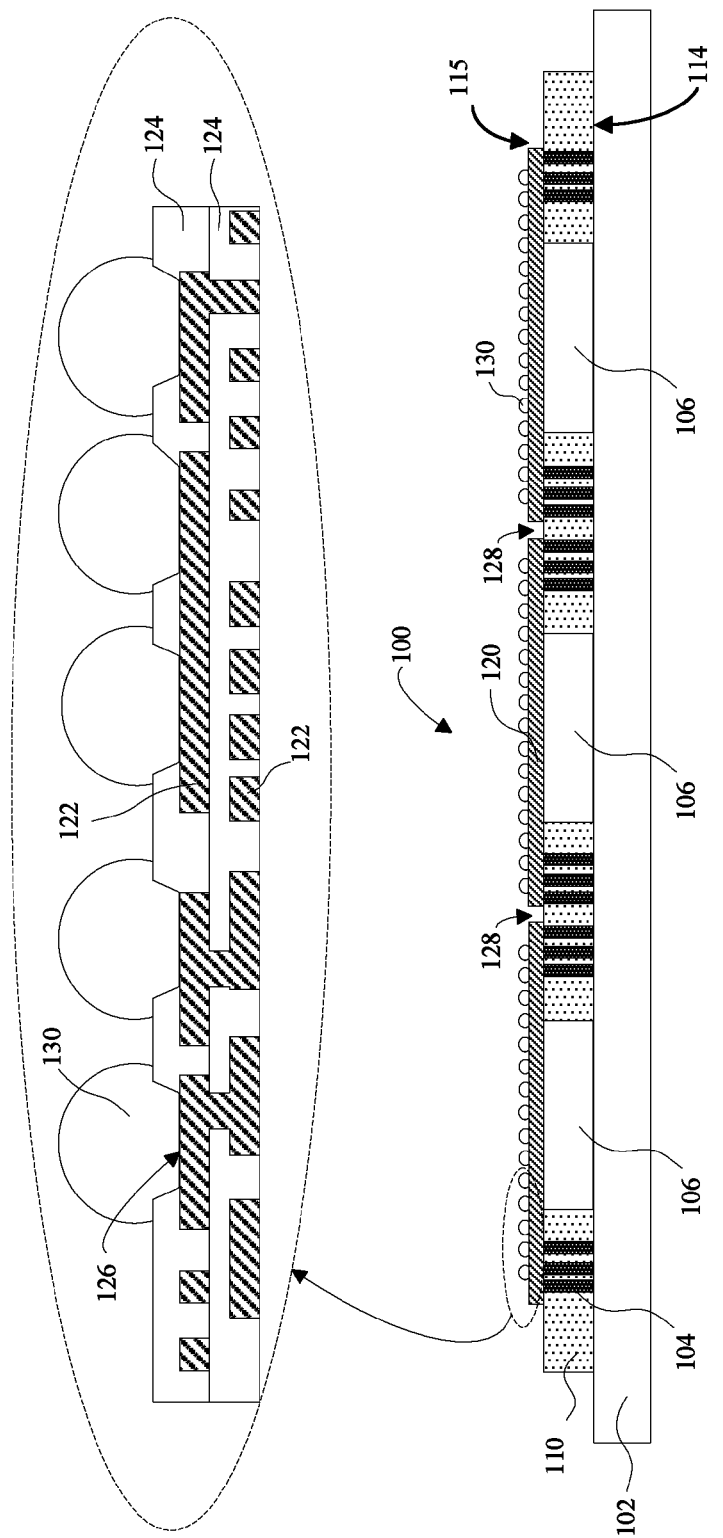
FIG. 1 is a cross-sectional side view illustration of a fan-out substrate including multiple embedded bottom die in accordance with an embodiment.

Embodiments describe package on package (PoP) structures and manners of fabrication. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the particular features, structures, configurations, or characteristics may be combined in any suitable manner in one or more embodiments.

The terms "over", "to", "between" and "on" as used herein may refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

Embodiments describe PoP structures and manners of fabrication which may address warping and thermal performance issues found in conventional PoP structures and fabrication processes. It has been observed that as the thickness and pitch in PoP packages is reduced there is a greater potential for warping of either the top or bottom packages, particularly after PoP joint formation (reflow of the conductive bumps attaching the two package structures). Warping can additionally occur at the large-scale across a fan-out substrate where the bottom package of a PoP structure is formed using a fan-out wafer level packaging (FOWLP) or fan-out panel level packaging process. Thus, warping can be at the local PoP structure level and at the wafer or panel level across multiple PoP structures prior to singulation. Warping may lead to failure or reduced performance of the resultant PoP structure and/or problems in reliability of devices incorporating the PoP structure.

In one aspect, embodiments describe a fan-out PoP fabrication manner in which a thickness of a fan-out substrate is partially cut to address warpage. For example, trenches may be cut into an overmold in which embedded bottom die are embedded. The cuts may reduce residual stress in the fan-out substrate (including the embedded bottom die, shared overmold and redistribution layers) during the remaining process sequence of forming the fan-out PoP structures.

In one aspect, embodiments describe a fan-out PoP fabrication manner in which the fan-out substrate is flattened/constrained when held by a vacuum chuck (or other suitable chucking mechanism) during certain processing sequences of forming the PoP structure in order to address warpage. For example, the fan-out substrate may be flatted/constrained by vacuum chucking during dispensing of a thermal interface material (TIM) on the embedded bottom die, placement of the top packages on the embedded bottom die, and during PoP joint formation.

In one aspect, embodiments describe fan-out PoP structures and manners of fabrication in which a thermal interface material (TIM) is provided at the embedded bottom die area of the fan-out substrate and beneath a corresponding top package. In this manner, the TIM may improve thermal properties of the fan-out PoP structure and add mechanical protection to the top packages. In an embodiment, the TIM may aid in securing the top packages, reduce x-y shifting of the top packages prior to and during PoP joint formation, and control z-height prior to and during PoP joint formation.

In one aspect, embodiments describe a fan-out PoP fabrication manner in which a thermal compression tooling constrains the top packages during PoP joint formation. In this manner, constraining the top packages may address warpage of the top packages, x-y shifting of the top packages, and z-height control of the PoP gap between the top and bottom packages. In addition, in embodiments employing a TIM, constraining the top packages with the thermal compression tooling may aid in achieving a uniform TIM bond-line thickness (BLT), which may improve thermal performance as well as warping.

In an embodiment, a thermal compression tooling is sized to fit over all of the top packages and simultaneously bond the top packages to the fan-out substrate for PoP joint formation. In an embodiment, the thermal compression tooling includes a rim spacer that fits around the top packages, and an array of package spacers. The rim spacer and package spacers may be characterized by a same height. The array of package spacers may define an array of cavities into which an array of top packages fit for PoP joint formation. Additionally, an arrangement of vents may be formed through a top surface of the thermal compression tooling to allow for the escape of volatile components during PoP joint formation.

In the following description, fan-out PoP fabrication manners and structures are described and illustrated which include structural features and processing techniques that may aid in addressing warpage of the top and bottom packages in a fan-out PoP structure. It is to be appreciated, that while the structures and processing techniques are described and illustrated cumulatively, that embodiments are not so limited, and embodiments may incorporate some and not all of the structural features and processing techniques.

Referring now to FIG. 1, a fan-out substrate is illustrated in accordance with an embodiment. As shown, a fan-out substrate 100 is supported by a carrier substrate 102 such as a wafer (e.g. silicon), glass, metal, or polymer. In the following description carrier substrate 102 is illustrated as circular. In an embodiment, carrier substrate is a 300 mm wafer. Carrier substrate 102 may also be rectangular or square, for example, as related to fan-out panel level packaging applications. A size and shape of the carrier substrate and fan-out substrate can be varied depending upon application. An array of embedded bottom die 106 is on the carrier substrate 102 and embedded within an overmold 110. Each embedded bottom die 106 may be, for example, a silicon chip, an integrated circuit die, or a flip chip die. In an embodiment, embedded bottom die 106 is a logic die. For example, embedded bottom die 106 may be a system on chip (SoC). Overmold 110 may be an encapsulant material such as a polymer or mold compound, for example, epoxy. Through interconnects 104 may extend through the overmold 110 to provide an electrical connection therethrough from an active side 115 of the fan-out substrate 100 to an opposite surface 114 of the fan-out substrate 100 on the carrier substrate 102. In an embodiment through interconnects 104 are formed of copper.

A redistribution layer 120 may be formed over the overmold 110, through interconnects 104, and embedded bottom die 106. The redistribution layer 120 includes one or more layers of conductive lines 122, such as copper, and passivation layers 124 to fan-out electrical connections with the embedded bottom die 106 and through interconnects 104. Openings 126 are formed in a top passivation layer 124 to accommodate conductive bumps 130, such as solder balls. Openings 128 may additionally be patterned in the redistribution layer 120 on an active side 115 of the fan-out substrate at locations between or surrounding the embedded bottom die 106 and through interconnects 104 that will be included in each bottom package of the PoP structure to be formed. In this manner, the electrical fan-out will be separate for each bottom package. In an embodiment, openings 128 are not formed, and one or more top passivation layers 124 extend between each embedded bottom die 106, while the conductive lines 122 are not formed in such regions, so that the electrical fan-out is separate for each bottom package.

Figure 2:
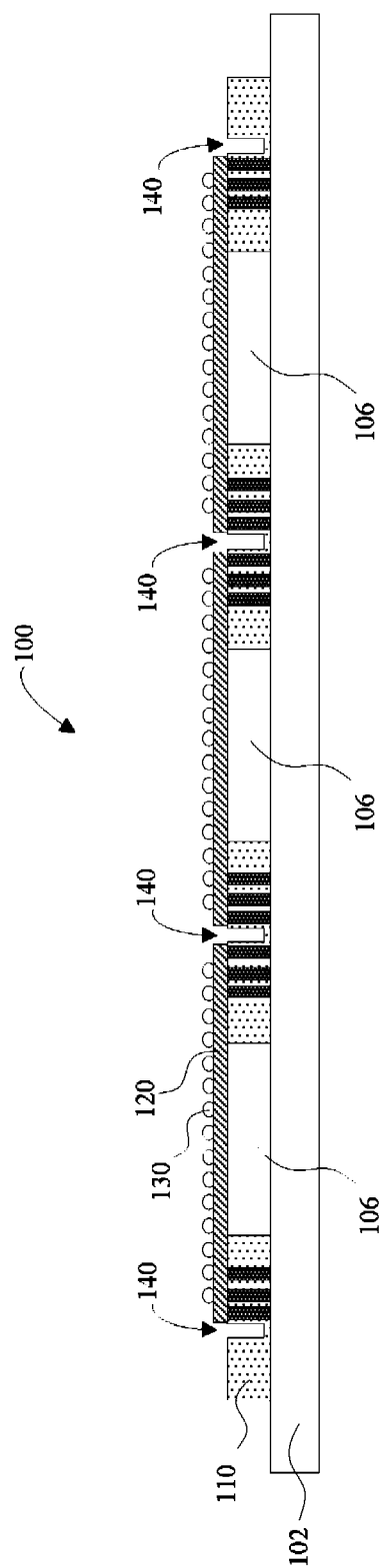
FIG. 2 is a cross-sectional side view illustration of trenches formed partially through a fan-out substrate in accordance with an embodiment.

Referring now to FIG. 2, trenches 140 are formed partially though the fan-out substrate 100 on the active side 115 using a suitable technique such as laser cutting or cutting with a mechanical saw. In this manner, the cut trenches 140 may release residual stress in the fan-out substrate, which can assist in flattening the fan-out substrate 100 and reducing warpage, for example when fan-out substrate 100 is heated. In an embodiment, the trenches 140 are cut to a distance d below a top surface of the fan-out substrate, where d is less than t, with t being a thickness of the fan-out substrate. In the particular embodiment illustrated, the trenches 140 are formed through existing openings 128 in the redistribution layer 120. As shown, trenches 140 extend partially through the overmold 110 and do not reach the carrier substrate 102. While the fan-out substrate 100 has been described and illustrated using particular structural features, embodiments are not limited to the particular fan-out substrate structure described and illustrated. For example, a variety of additional layers can be included, such as a bottom redistribution layer, or an alternative through interconnect structure, while trenches 140 may still be formed partially through a fan-out substrate including an array of embedded bottom die without extending completely through the fan-out substrate.

Figure 3A:
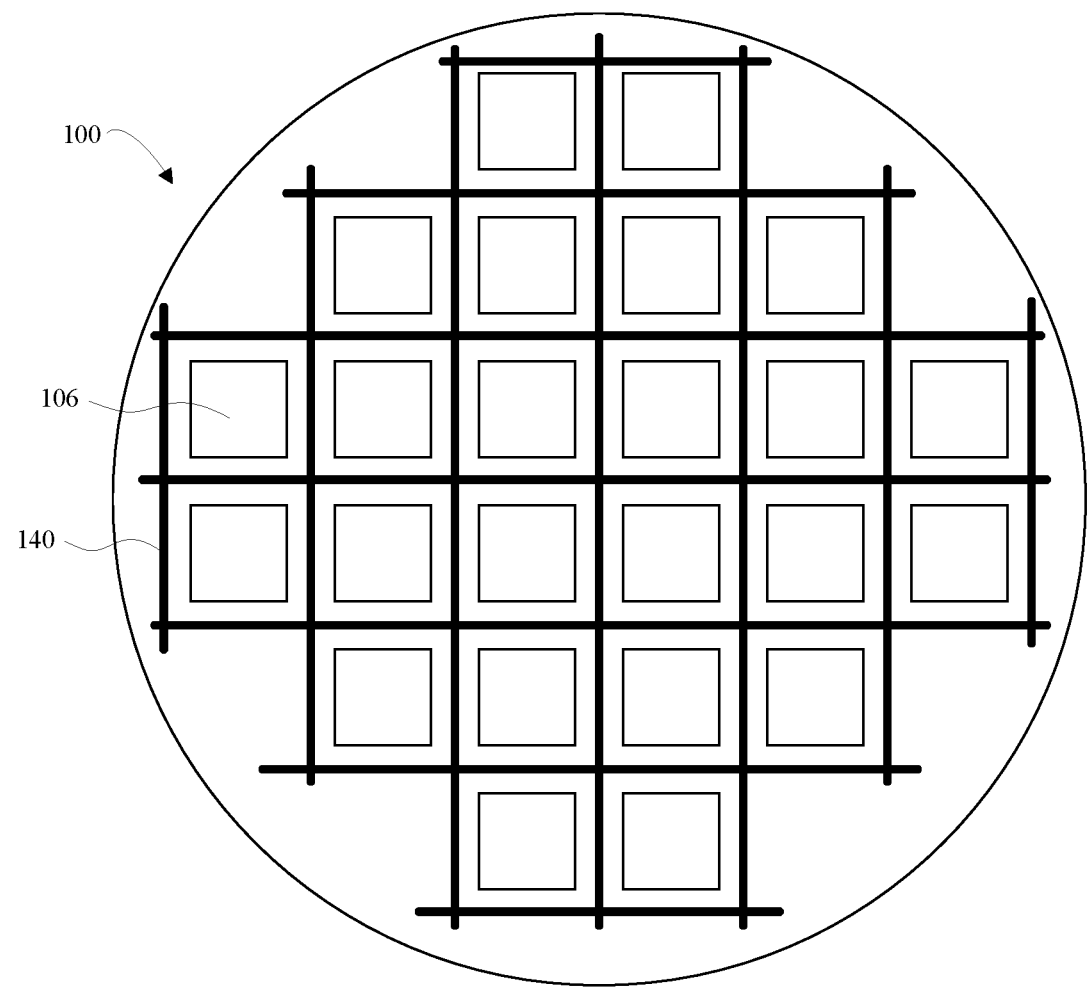
FIGS. 3A-3B are schematic top view illustrations of arrangements of trenches formed partially through a fan-out substrate including embedded bottom die in accordance with embodiments.
Figure 3B:
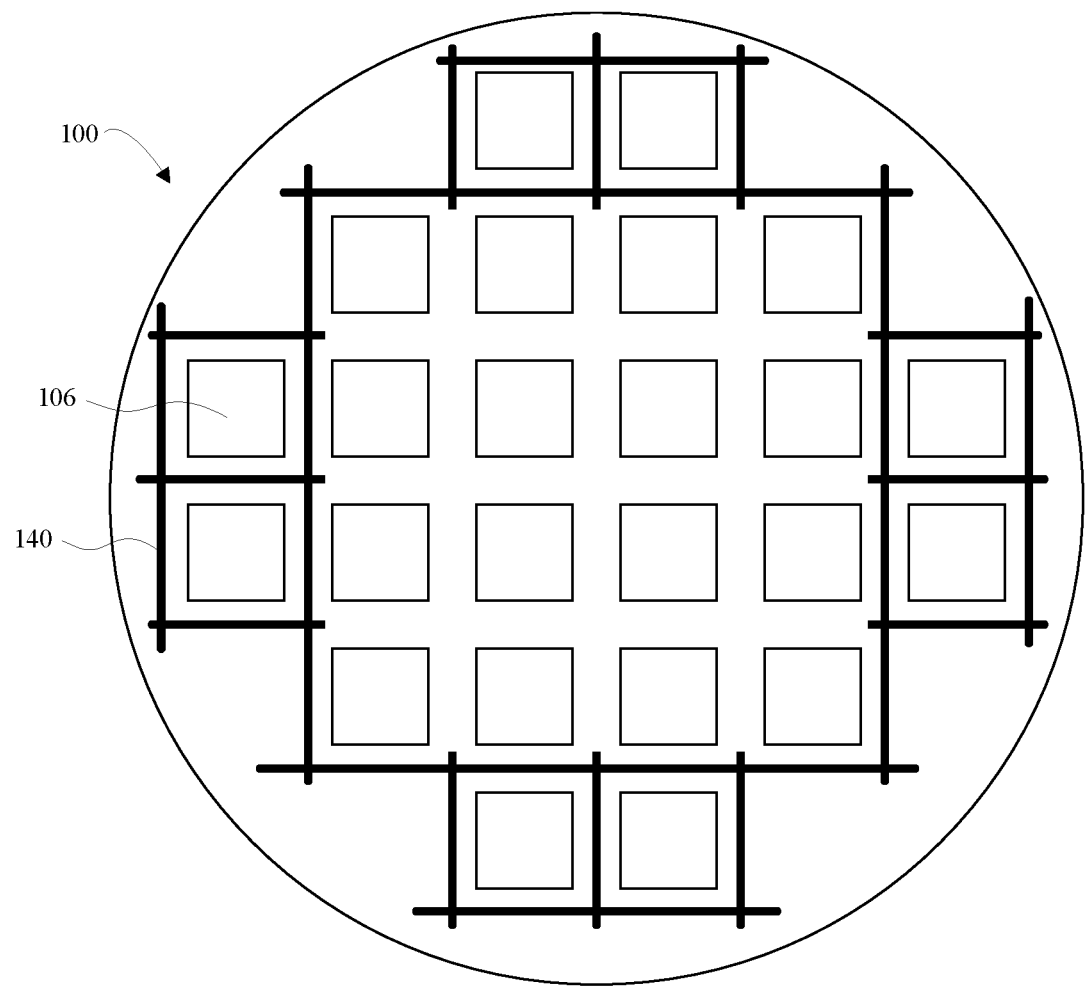

FIG. 3A is a schematic top view illustration of an arrangement of trenches 140 formed partially through a fan-out substrate including embedded bottom die 106 in accordance with an embodiment. In the particular embodiment shown, trenches 140 extend at right angles between each embedded bottom die 106, and surround each embedded bottom die 106. In other embodiments alternative configurations are envisioned. In an embodiment, trenches 140 are arranged between multiple rows or columns of embedded bottom die 106. In an embodiment, trenches 140 do not extend entirely across (laterally, or vertically) the entire arrangement of embedded bottom die 106, and instead trenches 140 extend across sections of the arrangement of embedded bottom die and laterally between the embedded bottom die 106. In an embodiment, trenches 140 are approximately 30 µm-100 µm wide. Trenches 140 may be formed along areas of largest stress in the fan-out substrate 100. In an embodiment illustrated in FIG. 3B, trenches 140 are formed around a periphery of fan-out substrate 100. In the particular embodiment illustrated, trenches 140 are formed around a portion of the embedded bottom die 106 near edges of the fan-out substrate 100, where stress may be higher. In this manner, there is a higher concentration or density of trenches 140 near a periphery of the fan-out substrate 100 than a center of the fan-out substrate.

Figure 4:
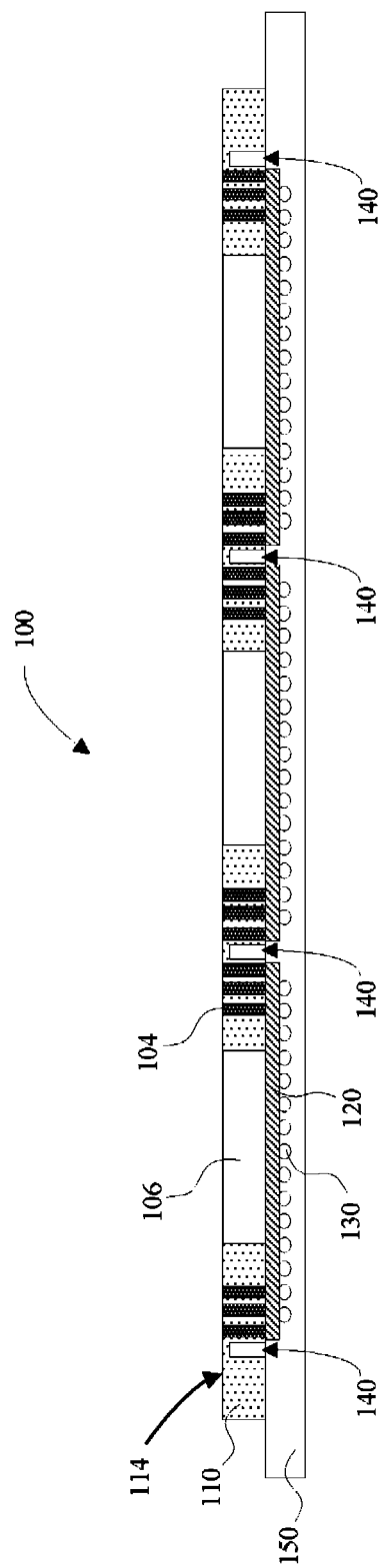
FIG. 4 is a cross-sectional side view illustration of a fan-out substrate with a cut overmold bonded to a temporary adhesive layer in accordance with an embodiment.

Following the formation of trenches 140, the active side 115 of the fan-out substrate 100 is mounted onto a temporary adhesive layer 150, and the carrier substrate 102 is removed, exposing surface 114 of the fan-out substrate 100, as illustrated in FIG. 4. As illustrated, the trenches 140 do not extend to surface 114. In the particular embodiment illustrated, surface 114 exposes the overmold 110, through interconnects 104, and embedded bottom die 106. As previously described above, fan-out substrate 100 may include additional layers, such as a redistribution layer at surface 114.

Figure 5:
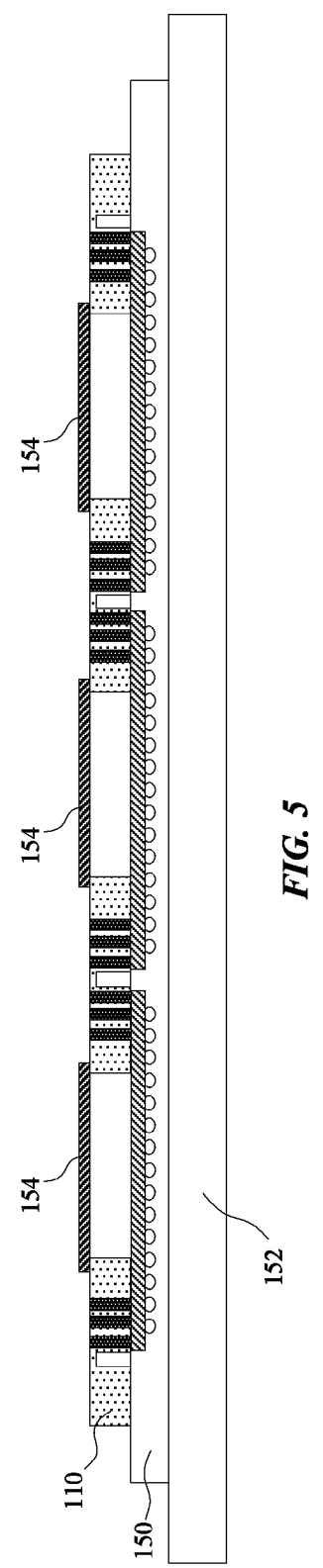
FIG. 5 is a cross-sectional side view illustration of a thermal interface material formed over embedded bottom die of a fan-out substrate while the fan-out substrate is constrained by a vacuum chuck in accordance with an embodiment.

Referring now to FIG. 5, in an embodiment a plurality of laterally separate locations of a thermal interface material (TIM) 154 are dispensed over the embedded bottom die 106. In an embodiment, TIM 154 may then be at least partially cured or dried after PoP joint formation. In the embodiment illustrated, the fan-out substrate 100 is secured with a vacuum chuck 152 (or other suitable chucking mechanism) to flatten the fan-out substrate during application of TIM 154. Suitable dispensing techniques include, but are not limited to, ink jet printing or screen printing. A variety of materials may be used as the TIM in accordance with embodiments. For example, the TIM may be an adhesive, thermal grease (e.g. a thermally conductive filler dispersed in a silicone or hydrocarbon oil to form a paste), or gel. In application, the TIM may be used as an underfill and may improve thermal performance of the completed PoP structure. In addition, a TIM may be easily deformed by small contact pressures with minimal leakage, or flow. In this manner, the TIM may be selectively located and not flow away from the area it was applied. In addition, the TIM may add mechanical protection to the top packages, secure the top packages to the fan-out substrate, reduce x-y shifting of the top packages, and provide z-height control. In an embodiment, the TIM is a silicone-based thermal grease. In an embodiment, rather than applying a TIM, a more traditional underfill material 155 is applied. Underfill material 155 may be an encapsulant material (e.g. a polymer or mold compound, for example, epoxy) or a non-conductive paste (e.g. elastomeric paste with thermally conductive particles). Such an embodiment is described in more detail with regard to FIG. 12.

Figure 6:
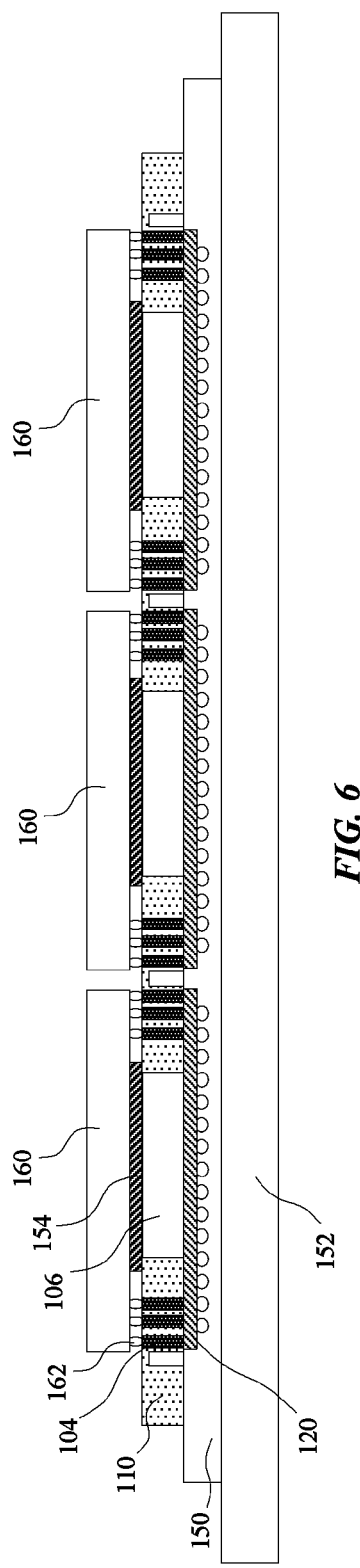
FIG. 6 is a cross-sectional side view illustration of a plurality of top packages placed onto embedded bottom die of a fan-out substrate in accordance with an embodiment.

Referring now to FIG. 6, in an embodiment top packages 160 are picked and placed onto the fan-out substrate directly over the embedded bottom die 106. In an embodiment, the top packages 160 are separated by a pitch of 100-300 µm across the fan-out substrate, though these pitches are exemplary, and can be varied depending upon application. Likewise, a size and shape of the fan-out substrate can be varied depending upon application. Flux or conductive paste can be applied to conductive bumps 162 using a suitable technique such as dipping, dispensing or jetting. In an embodiment, conductive bumps 162 (e.g. solder balls, printed conductor, or plated conductor) can be pre-formed on the top packages 160. In an embodiment, conductive bumps 162 are formed on the fan-out substrate prior to picking and placing the top packages 160. As illustrated in FIG. 6, conductive bumps 162 electrically connect the top packages 160 with the through interconnects 104 and redistribution layer 120.

The TIM 154 may add mechanical protection to the top package 160. For example, the TIM 154 can aid in securing and controlling z-height of the top package 160 at this stage, and additionally aid against x-y shift in the top packages 160 prior to being permanently joined. In the embodiment illustrated in FIG. 6, the conductive bumps 162 of a top package 160 laterally surround a corresponding laterally separate location of conductive paste 154 underneath the top package 160. In an embodiment, the TIM 154 does not contaminate the conductive bumps 162 or spill out from underneath the top package 160 at this stage, or during subsequent PoP joint formation.

Figure 7:
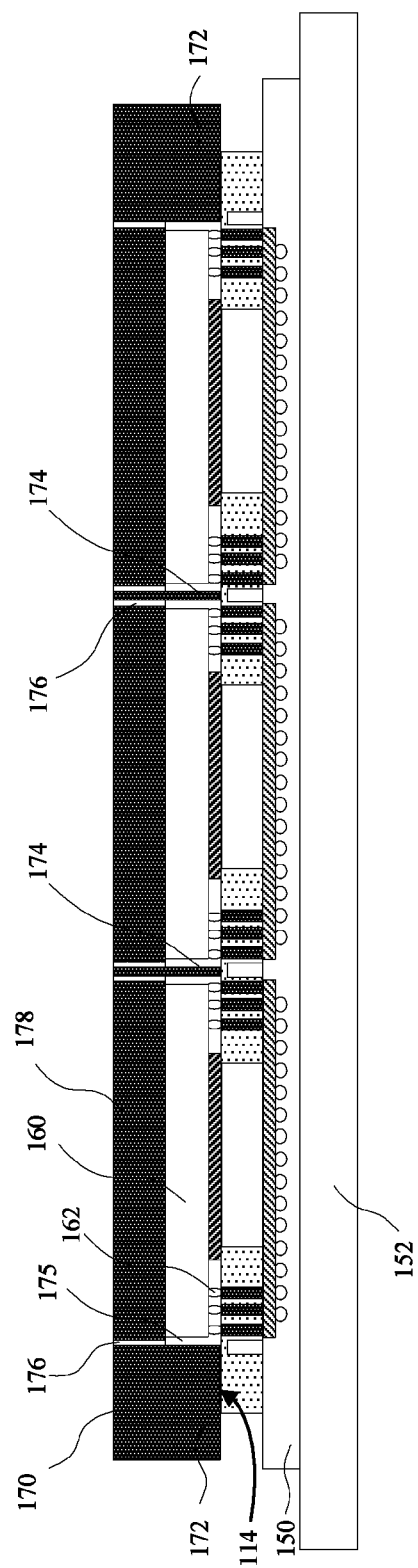
FIG. 7 is a cross-sectional side view illustration of a thermal compression tool bonding the top packages to a fan-out substrate while the fan-out substrate is constrained by a vacuum chuck in accordance with an embodiment.

PoP joint formation may then be accomplished by bringing a thermal compression tool 170 into contact with the array of top packages 160 and the fan-out substrate to thermally join the array of top packages 160 and the fan-out substrate, as illustrated in FIG. 7. In an embodiment, the thermal compression tool 170 includes a base 178, a rim spacer 172 extending from the base 178, and an array of package spacers 174 extending from the base 178, in which the array of package spacers define an array of cavities 175. The rim spacer 172 may laterally surround the package spacers 174 and the top packages 160 on the fan-out substrate. As illustrated, the array of cavities 175 receives the array of top packages 160. In an embodiment, the array of cavities 175 receives all of the top packages 160 that have been placed onto the fan-out substrate.

Figure 8:
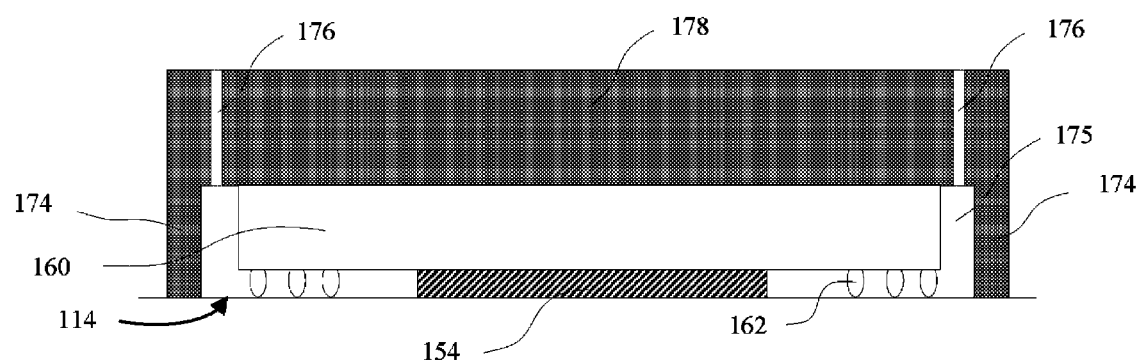
FIG. 8 is a close-up cross-sectional side view illustration of a portion of a thermal compression tool over a top package in accordance with an embodiment.

FIG. 8 is a close-up cross-sectional side view illustration of a portion of a thermal compression tool over a top package in accordance with an embodiment. In the particular embodiments illustrated, the rim spacers 172 and package spacers 174 have the same height extending from the base 178, and make contact with the surface 114 of the fan-out substrate. In an embodiment, each cavity 175 receives a single top package 160. In an embodiment, spacers 172, 174 have a height of approximately 350 µm-400 µm, though the height is exemplary and may vary depending upon application. The amount of open space in cavities 175 between sidewalls of the package spacers 174 and top packages 160 may be designed to define a maximum tolerance of x-y shift of the top packages 160, and accommodate a vent hole 176 extending entirely through the base 178 to allow volatiles to escape during joint formation with the conductive bumps 162, particularly where a flux is used. In an embodiment, there is approximately 40 µm-100 µm of space around the top packages 160 within each cavity 175. The upper surface of the cavity 175 corresponding to the base 178 along with height of the spacers 172, 174 may control z-height of the PoP gap between the top and bottom packages during PoP joint formation. In an embodiment, at least one vent hole is located in each cavity 175.

In an embodiment, the fan-out substrate is held by a vacuum chuck 152 during PoP joint formation, while thermal compression tool 170 contacts the array of top packages 160 and the fan-out substrate to thermally joint the array of top packages to the fan-out substrate. In this manner, the vacuum chuck can address warpage of the fan-out substrate while the thermal compression tool 170, and optionally the TIM 154 address warpage of the top packages 160. In this manner, mechanisms are in place during thermal compression to simultaneously address warpage of the resultant top and bottom packages of the PoP structure, and across substrate level (such as wafer-level or panel-level). In the particular embodiment illustrated incorporating a TIM 154, use of the thermal compression tool 170 may aid in achieving a uniform TIM 154 bond-line thickness (BLT), which may improve thermal performance as well as warping.

Figure 9A:
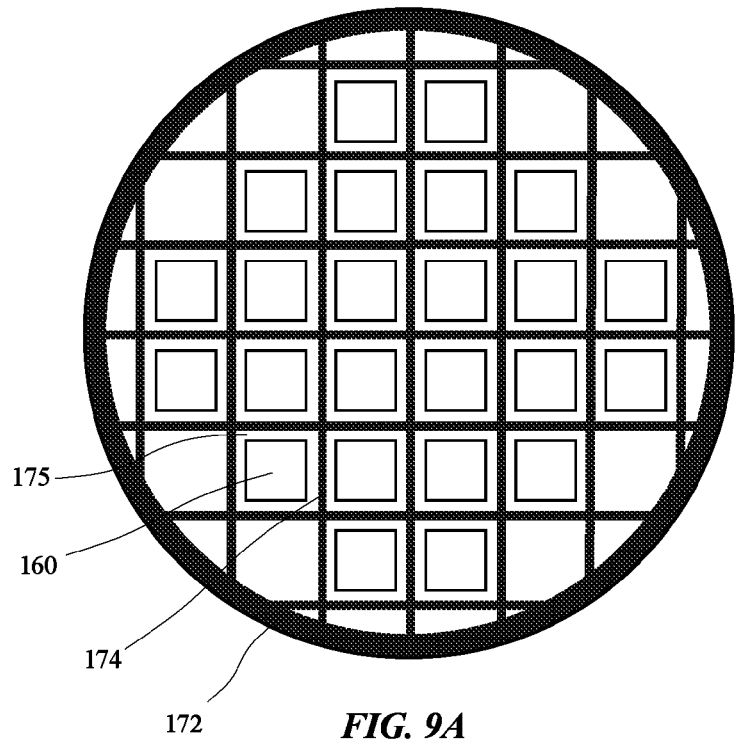
FIGS. 9A-9C are schematic top view illustrations of arrangements of thermal compression tool spacers and top packages in accordance with embodiments.
Figure 9B:
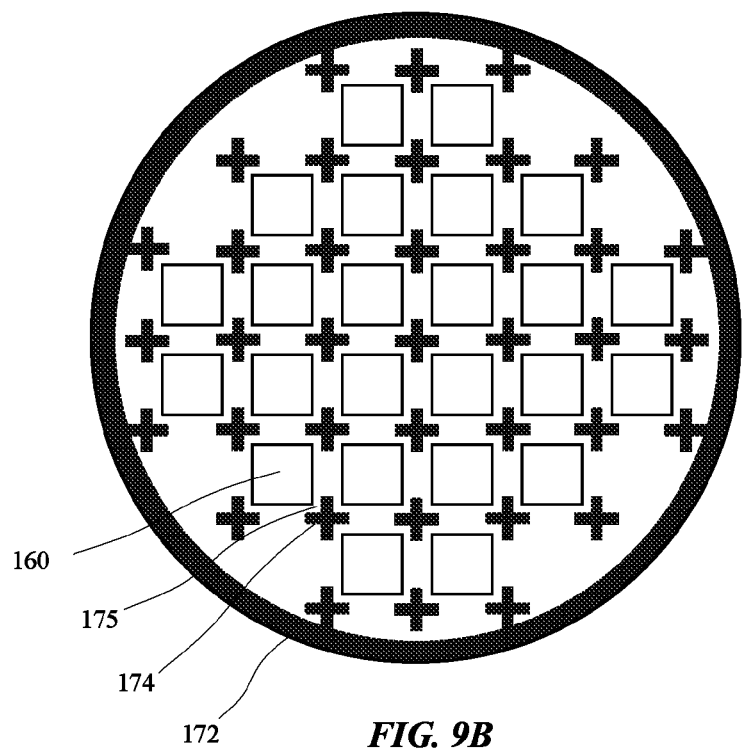
Figure 9C:
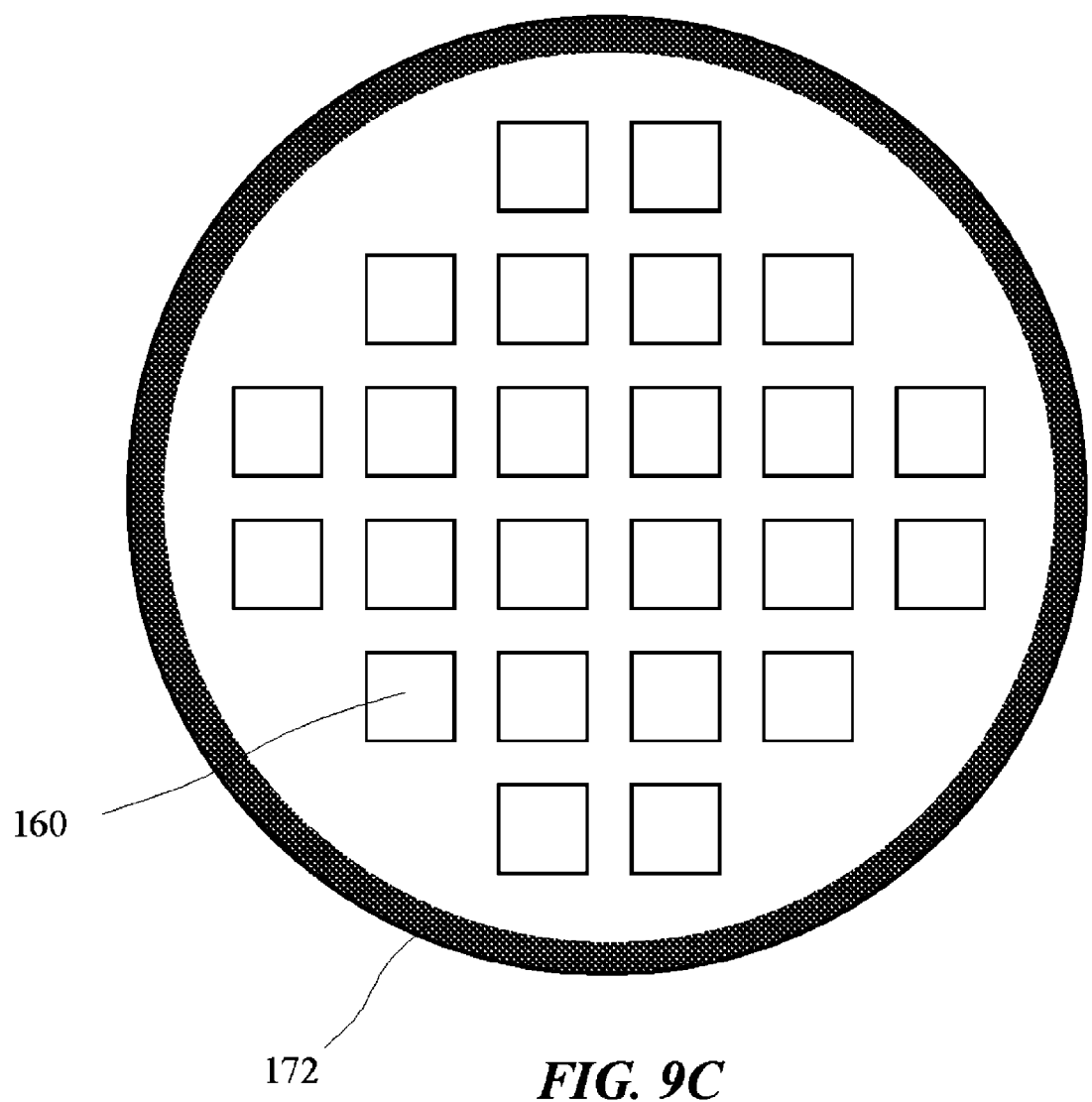

Referring now to FIGS. 9A-9C, different schematic top view illustrations are provided to illustrate exemplary arrangements of the rim spacer 172 and package spacers 174. In the embodiment illustrated in FIG. 9A, the package spacers 174 are arranged in a grid configuration of rows and columns extending between opposite sides of the rim spacer 172. In the embodiment illustrated in FIG. 9B, the package spacers 174 are arranged in a rectangular corner configuration. For example, the package spacers 174 may have an X-shape, though others are contemplated. In the embodiment illustrated in FIG. 9C, a rim spacer 172 is present, with no package spacers. In an embodiment the thermal compression tool of FIG. 9C is used in combination with a TIM 154, in which the TIM aids in securing x-y shift of the top packages 160, while rim spacer controls z-height during PoP joint formation. In the embodiments illustrated in FIGS. 9A-9C, rim spacer 172 has been illustrated as circular. Rim spacer 172 may also be rectangular or square, depending upon application.

Figure 10:
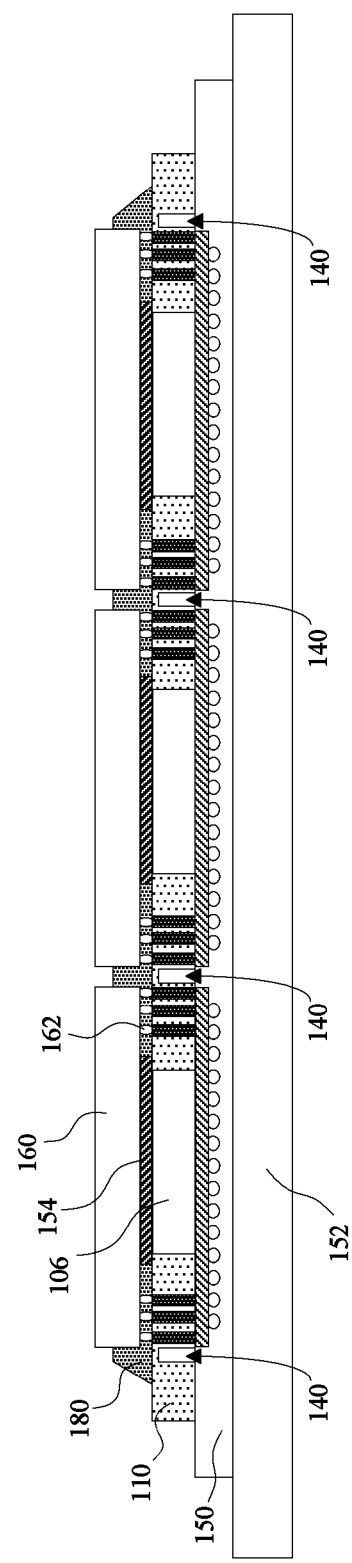
FIG. 10 is a cross-sectional side view illustration of an underfill material applied to the top packages in accordance with an embodiment.

Following PoP joint formation, in an embodiment an underfill material 180 is applied to the array of top packages, as illustrated in FIG. 10. Underfill material 180 may be an encapsulant material such as a polymer or mold compound, for example, epoxy. As illustrated, the underfill material 180 is applied between packages 160 and flows underneath packages 160 to surround the PoP joints (e.g. conductive bumps 162 that join the top package 160 to the bottom package) and is then cured. In this manner, the underfill material 180 can provide mechanical and chemical protection to the PoP joints. As illustrated, the underfill material 180 additionally surrounds the TIM 154 underneath each top package 160. In an embodiment, the underfill material 180 is characterized by a lower thermal conductivity than the TIM 154. For example, the TIM 154 may have a thermal conductivity k value of approximately 3-10 W per meter per Kelvin ($W \cdot m^{-1} \cdot K^{-1}$), for example, when formed of a silicone-based material, while an epoxy containing underfill material 180 may have a thermal conductivity k value of approximately 0.5-3 W per meter per Kelvin ($W \cdot m^{-1} \cdot K^{-1}$). Both the TIM 154 and underfill material 180 may have approximately the same thickness between the top package 160 and the fan-out substrate, or bottom package to be formed as illustrated in FIGS. 11-12.

Following the application and curing of the underfill material 180, an array of PoP structures 200 is singulated from the fan-out substrate and array of top packages 160, with each separate PoP structure including a bottom package 202 (including an embedded bottom die 106) and a top package 160 on the bottom package. For example, singulation may be performed using a wafer saw. In an embodiment, the wafer saw has a cut width of approximately 60 um-300 µm. In an embodiment, the wafer saw cuts above the existing trenches 140 and removes any artifact of trenches 140. In an embodiment, the remaining redistribution layer 120 is not as wide as the overmold 110 layer as a result of the openings 128 being wider than the cuts formed during singulation. In an embodiment, openings 128 are also removed as a result of singulating.

Figure 11:
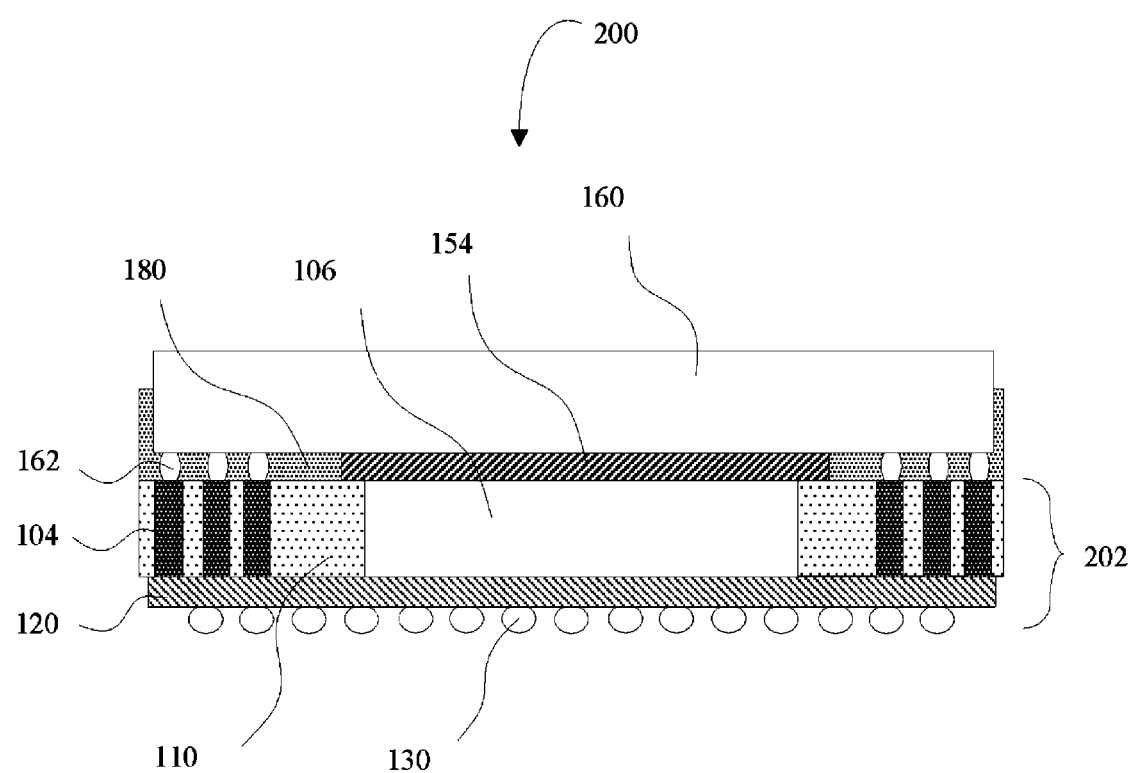
FIG. 11 is a cross-sectional side view illustration of a singulated fan-out package on package structure in accordance with an embodiment.

FIG. 11 is a cross-sectional side view illustration of a singulated fan-out PoP structure in accordance with an embodiment. As illustrated, the PoP structure 200 includes a thermal interface material 154 and cured underfill material 180 as described above. The remaining redistribution layer 120 is not as wide as the overmold 110 layer as a result of the openings 128 being wider than the cuts formed during singulation. Alternatively, they may have the same width. As illustrated, the underfill material 180 additionally spreads along lateral sidewalls of the top package 160.

Figure 12:
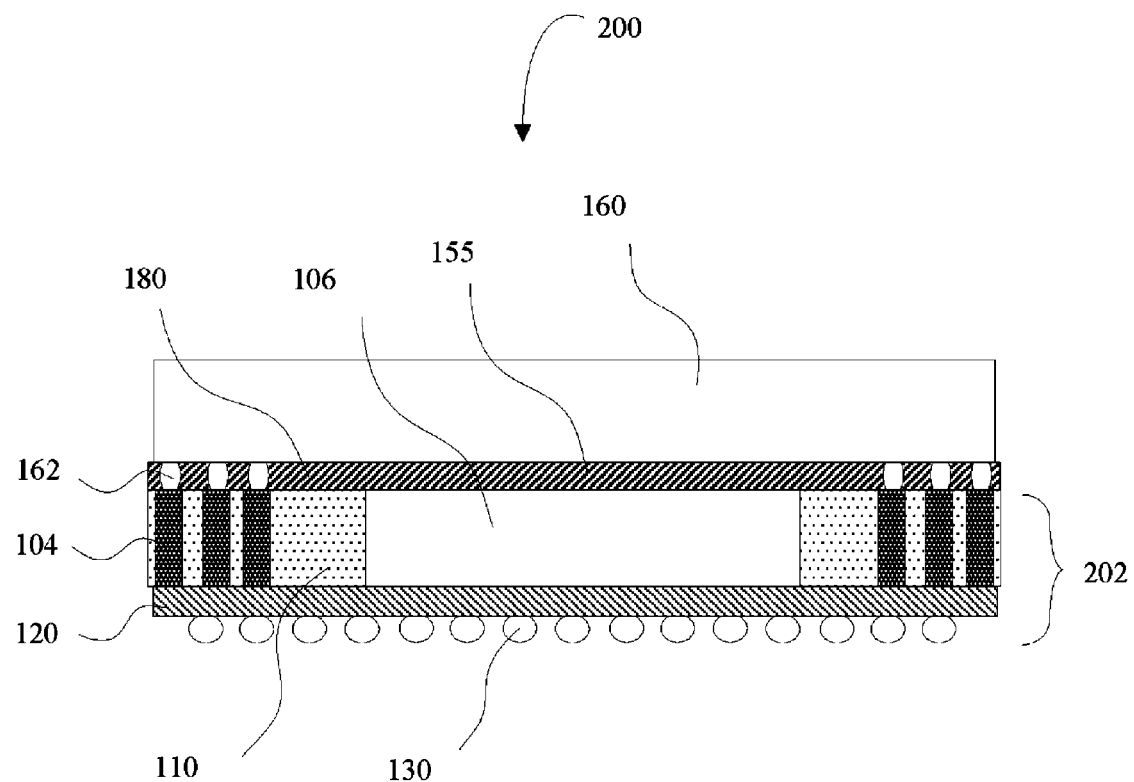
FIG. 12 is a cross-sectional side view illustration of a singulated fan-out package on package structure in accordance with an embodiment.

FIG. 12 is a cross-sectional side view illustration of a singulated fan-out PoP structure in accordance with an embodiment. As described above with regard to FIG. 5, in an embodiment, rather than dispensing a TIM 154, laterally separate locations of underfill material 155 are dispensed over the array of embedded bottom die 106. Underfill material 155 may be an encapsulant material (e.g. a polymer or mold compound, for example, epoxy) or a non-conductive paste (e.g. elastomeric paste with thermally conductive particles). In such an embodiment, the underfill material 155 spreads out and surrounds the conductive bumps 162 used to form the PoP joints. Accordingly, in such an embodiment, the underfill material 155 is pre-applied prior to PoP joint formation, for example with thermal compression tool 170.

In utilizing the various aspects of the embodiments, it would become apparent to one skilled in the art that combinations or variations of the above embodiments are possible for forming a PoP structure. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A method of forming a semiconductor device package comprising:

forming an array of trenches partially through an active side of a fan-out substrate, wherein a second side of the fan-out substrate opposite the active side is supported by a carrier substrate during forming the array of trenches, and the fan-out substrate further comprises:

a plurality of embedded bottom die on the carrier substrate and embedded within a polymer-based molding compound; and a redistribution layer spanning over the polymer-based molding compound and the plurality of embedded bottom die, wherein the redistribution layer includes a plurality of conductive lines that fan-out electrical connections with the plurality of embedded bottom die;

removing the carrier substrate after forming the array of trenches partially through the active side of the fan-out substrate; and placing an array of top packages onto the second side the fan-out substrate after removing the carrier substrate.

2. The method of claim 1, wherein the array of top packages are placed onto the second side of the fan-out substrate directly over the array of embedded bottom die.

3. The method of claim 1, wherein the trenches do not extend completely through the polymer-based molding compound.

4. The method of claim 1, further comprising prior to removing the carrier substrate from the fan-out substrate, mounting the active side of the fan-out substrate to a temporary adhesive layer.

5. The method of claim 1, wherein placing the array of top packages onto the fan-out substrate comprises bringing a thermal compression tool into contact with the array of top packages and the fan-out substrate to thermally join the array of top packages and the fan-out substrate, wherein the thermal compression tool includes a plurality of spacers structures that define an array of cavities that receive the array of top packages.

6. The method of claim 5, further comprising holding the fan-out substrate on a vacuum chuck while bringing the thermal compression tool into contact with the array of top packages and the fan-out substrate to thermally join the array of top packages and the fan-out substrate.

7. The method of claim 1, wherein the fan-out substrate further includes an array of through interconnects that extend through the polymer-based molding compound to provide electrical connections from the redistribution layer to the second side of the fan out substrate.

8. The method of claim 7, wherein placing an array of top packages onto the second side the fan-out substrate comprises connecting the array of top packages to the array of through interconnects with conductive bumps.

9. The method of claim 8, further comprising applying an underfill material to the array of top packages after placing an array of top packages onto the second side the fan-out substrate.

10. The method of claim 8, further comprising singulating multiple package structures, each package structure including an embedded bottom die and a plurality of the through interconnects.

11. The method of claim 10, wherein singulating the multiple package structures comprises cutting though the array of trenches.

12. The method of claim 1, wherein the redistribution layer comprises multiple layers of conductive lines.

13. The method of claim 1, wherein the polymer-based molding compound comprises epoxy.

14. The method of claim 1, wherein each embedded bottom die comprises a system on chip die.

15. The method of claim 14, wherein each top package comprises a memory package.

16. The method of claim 1, wherein each embedded bottom die comprises a memory die.

17. The method of claim 16, wherein each top package comprises a memory package.

* * * * *